(12) United States Patent
Oren

(10) Patent No.: US 8,055,990 B2
(45) Date of Patent: Nov. 8, 2011

(54) METHOD AND SYSTEM FOR ERROR DETECTION FOR IMPROVING DATA INTEGRITY IN PROTOCOL OFFLOADING

(75) Inventor: Amit Oren, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 1092 days.

(21) Appl. No.: 11/834,835

(22) Filed: Aug. 7, 2007

(65) Prior Publication Data

US 2007/0277084 A1  Nov. 29, 2007

Related U.S. Application Data

(62) Division of application No. 10/756,880, filed on Jan. 4, 2004, now Pat. No. 7,343,541.

(60) Provisional application No. 60/439,921, filed on Jan. 14, 2003.

(51) Int. Cl.
*G06F 11/10* (2006.01)

(52) U.S. Cl. ........................................ 714/808

(58) Field of Classification Search .................... 714/808
See application file for complete search history.

(56) References Cited

U.S. PATENT DOCUMENTS

| | | | |
|---|---|---|---|
| 3,460,117 A * | 8/1969 | Cohn et al. ..................... | 714/807 |
| 4,597,083 A | 6/1986 | Stenerson | |
| 4,675,869 A | 6/1987 | Driessen | |
| 5,131,012 A | 7/1992 | Dravida | |
| 5,410,546 A | 4/1995 | Boyer et al. | |
| 5,594,861 A | 1/1997 | Jonsson et al. | |
| 5,778,013 A | 7/1998 | Jedwab | |
| 5,951,707 A | 9/1999 | Christensen et al. | |
| 6,038,694 A * | 3/2000 | Swallow ........................ | 714/781 |
| 6,223,320 B1 | 4/2001 | Dubey et al. | |
| 6,226,771 B1 | 5/2001 | Hilla et al. | |
| 6,411,599 B1 | 6/2002 | Blanc et al. | |
| 6,498,936 B1 * | 12/2002 | Raith ............................ | 455/466 |
| 6,532,565 B1 | 3/2003 | Roth et al. | |
| 6,681,364 B1 | 1/2004 | Calvignac et al. | |
| 6,973,084 B1 | 12/2005 | Jha | |
| 7,016,329 B2 | 3/2006 | Padovani et al. | |
| 2003/0031119 A1 | 2/2003 | Kim et al. | |
| 2003/0066011 A1 | 4/2003 | Oren | |

OTHER PUBLICATIONS

R.N. Williams, "A Painless Guide to CRC Error Detection Algorithms", Rocksoft Pty. Ltd., Hazelwood Pak, Australia, 1993.
"When the CRC and TCP Checksum Disagree", by Stone, et al., SIGCOMM 2000, pp. 309-319.
U.S. Appl. No. 60/439,921, filed Jan. 14, 2003, entitled: "Improving Data Integrity in Protocol Offloading".

* cited by examiner

*Primary Examiner* — Scott Baderman
*Assistant Examiner* — Enam Ahmed
(74) *Attorney, Agent, or Firm* — McAndrews, Held & Malloy, Ltd.

(57) ABSTRACT

Aspects of a method and system are provided for error detection for improving data integrity in protocol offloading. Aspects of the invention may enable receiving a block of data having a modulo-based input error detection code and an error correction term appended thereto, calculating an output error detection code of the block, combining the input error detection code and the error correction term to produce a modified error detection code, and comparing the calculated error detection code to the modified error detection code so as to detect an error in the block. The error correction term may be equal to a binary difference between the input error detection code and the output error detection code. The input error detection code and the error correction term may be combined by applying an XOR operation.

10 Claims, 4 Drawing Sheets

METHOD AND SYSTEM FOR ERROR DETECTION FOR IMPROVING DATA INTEGRITY IN PROTOCOL OFFLOADING

CROSS-REFERENCE TO RELATED APPLICATIONS/INCORPORATION BY REFERENCE

This application is a divisional of U.S. application Ser. No. 10/756,880 filed Jan. 1, 2004, which makes reference to, claims priority to, and claims the benefit of U.S. Provisional Patent Application Ser. No. 60/439,921 filed on Jan. 14, 2003.

This patent application also makes reference to:
U.S. patent application Ser. No. 10/123,024 filed Apr. 11, 2002, published as U.S. patent application Publication No. 2003/0066011, which is assigned to the assignee of the present patent application.

Each of the above stated applications is hereby incorporated herein by reference in its entirety.

FIELD OF THE INVENTION

The present invention relates generally to digital error detection, and specifically to methods and devices for computing and checking error detection codes.

BACKGROUND OF THE INVENTION

Error detection codes are used in all sorts of digital communication applications to enable the receiver of a message transmitted over a noisy channel to determine whether the message has been corrupted in transit. Before transmitting the message, the transmitter calculates an error detection code based on the message contents, and appends the code to the message. The receiver recalculates the code based on the message that it has received and compares it to the code appended by the transmitter. If the values do not match, the receiver determines that the message has been corrupted and, in most cases, discards the message.

Cyclic redundancy codes (CRCs) are one of the most commonly-used types of error correcting codes. To calculate the CRC of a message, a polynomial g(X) is chosen, having N+1 binary coefficients $g_0 \ldots g_N$. The CRC is given by the remainder of the message, augmented by N zero bits, when divided by g(X). In other words, the CRC of an augmented message D(X) is simply D(X) mod g(X), i.e., the remainder of D(X) divided by g(X). There are many methods known in the art for efficient hardware and software implementation of CRC calculations. A useful survey of these methods is presented by Williams in "A Painless Guide to CRC Error Detection Algorithms" (Rocksoft Pty Ltd., Hazelwood Park, Australia, 1993), which is incorporated herein by reference.

CRCs are sometimes applied to more than one protocol of a data communications protocol stack. For example, in the protocol stack of the recently proposed Remote Direct Memory Access (RDMA) over Internet Protocol (IP) standard, CRCs are applied to both the Ethernet MAC and Marker PDU Aligned (MPA) protocols.

In high bandwidth systems, e.g., systems supporting 10 Gbps line rates, protocol stack processing may be resource-intensive for a host that interfaces with a communications network. Therefore, it is sometimes desirable for the host to offload a portion of the protocol stack processing to a network interface device (NID) that provides the host with an interface to the network. Protocols that are processed entirely by the NID are said to be "terminated" by the NID.

A drawback to such offloading is that the data transferred from the NID to the host may be corrupted by the NID and/or during transfer from the NID to the host. When the host does not terminate the data-intensive protocol or protocols that include the CRC calculation, the host is generally unable to detect such data corruption using methods known in the art. To overcome this drawback, it has been proposed that the NID calculate a CRC for the data to be transferred to the host. If the data has already been corrupted in the NID prior to calculation of the CRC, however, the CRC merely ensures accurate transmission of corrupted data to the host.

It has been demonstrated that data corruption by network hardware is a common occurrence. For example, Stone et al., in "When the CRC and TCP checksum disagree," SIGCOMM 2000, pp. 309-319, studied nearly 500,000 IP packets which failed the Transport Control Protocol (TCP), User Datagram Protocol (UDP), or IP checksum. They write, "Probably the strongest message of this study is that the networking hardware is often trashing the packets which are entrusted to it."

The above-mentioned U.S. patent application Publication No. 2003/0066011, to Oren, describes a method for error detection that includes receiving a block of data that is divided into a plurality of sub-blocks having respective offsets within the block, and processing the data in each of the sub-blocks so as to compute respective partial error detection codes for the sub-blocks. The partial error detection codes of the sub-blocks are modified responsively to the respective offsets, and the modified partial error detection codes are combined to determine a block error detection code for the block of data.

SUMMARY OF THE INVENTION

A system and/or method is provided for error detection for improving data integrity in protocol offloading, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

In embodiments of the present invention, a host computer system offloads a portion of protocol stack processing to a network interface device (NID), which provides the host with an interface to a communications network. During processing of inbound network traffic, the NID receives input blocks of data from the network, which blocks include respective modulo-based error detection codes, such as a CRCs. The NID processes each of the input data blocks by dividing the input block into a plurality of sub-blocks, and concatenating a subset of the sub-blocks, not necessarily in their original order, to produce an output block. The NID determines an error correction term for the output block. This error term is equal to a binary difference between the input error detection code and an error detection code of the output block. The NID appends the original error detection code and the error correction term to the output block, and passes the output block to the host.

In order to determine whether to accept or reject the output block, the host calculates the error detection code of the output block, and compares this value to the original error detection code of the input block and the error correction term. To make this comparison, the host typically combines the original error detection code of the input block and the error correction term using an XOR operation. Thus, if data of the output block is corrupted during processing or transmission by the NID, data verification at the recipient fails, even if the NID used the corrupted data to compute the error correction term. This verification failure occurs because the NID propagates the original error detection code of the input block to the recipient, and the recipient uses this original error detection code in combination with the error correction term for data validation.

Typically, in order to determine the error correction term for the output block, the NID calculates a partial error correction term for each of the sub-blocks, and combines the partial error correction terms using XOR operations. For each sub-block that is not included in the output block (i.e., that the NID has removed during processing), the NID calculates the partial error correction term by binary-shifting the value of the sub-block by a number of bits equal to the offset of the sub-block in the input block, and taking the modulo of the result. For each sub-block that is included in the output block, the NID calculates the partial error correction term by XOR-ing (a) the modulo of the value of the sub-block binary shifted by a number of bits equal to the offset of the sub-block in the input block and (b) the modulo of the value of the sub-block binary shifted by a number of bits equal to the offset of the sub-block in the output block. In other words, the NID analyzes the position of the sub-block in the output block relative to the position thereof in the input block and uses the position information in calculating the error correction term.

In some embodiments of the present invention, during processing of outbound network traffic, the NID receives input blocks of data from the host, which blocks include respective modulo-based error detection codes, such as a CRCs. For each of the input blocks, the NID assembles an output data block by dividing the input block into sub-blocks, and interspersing additional sub-blocks containing protocol-related data, such as headers, markers, and padding. To compute an error detection code, such as a CRC, for the output block, the NID calculates an error correction term based on the positions of the sub-blocks in the output block relative to their respective positions in the input block, as described hereinabove. The NID applies this error correction term to the error detection code of the input block, typically using an XOR operation, in order to produce the error detection code of the output block. Thus, if data of the input block is corrupted during transmission to the NID or processing by the NID, the NID does not calculate the error detection code of the output block over the corrupted data. Instead, the NID propagates the error detection code of the input block, as modified, to the recipient.

For some applications, the techniques described herein are used with the recently proposed RDMA over IP protocol stack, which includes the following protocols, arranged from highest to lowest level: Remote Direct Memory Access Protocol (RDMAP), Direct Data Placement (DDP) Protocol, Marker PDU Aligned (MPA) Framing, TCP, IP, and Ethernet MAC. CRCs are applied to both the Ethernet MAC and MPA protocols. For example, the host may terminate RDMAP, while the NID terminates all of the other protocols of the RDMA protocol stack, and passes the original CRC and the error correction term (as described above) to the host for use in verifying the RDMA payload.

The present invention will be more fully understood from the following detailed description of embodiments thereof, taken together with the drawings in which:

DETAILED DESCRIPTION OF EMBODIMENTS

Figure 1:
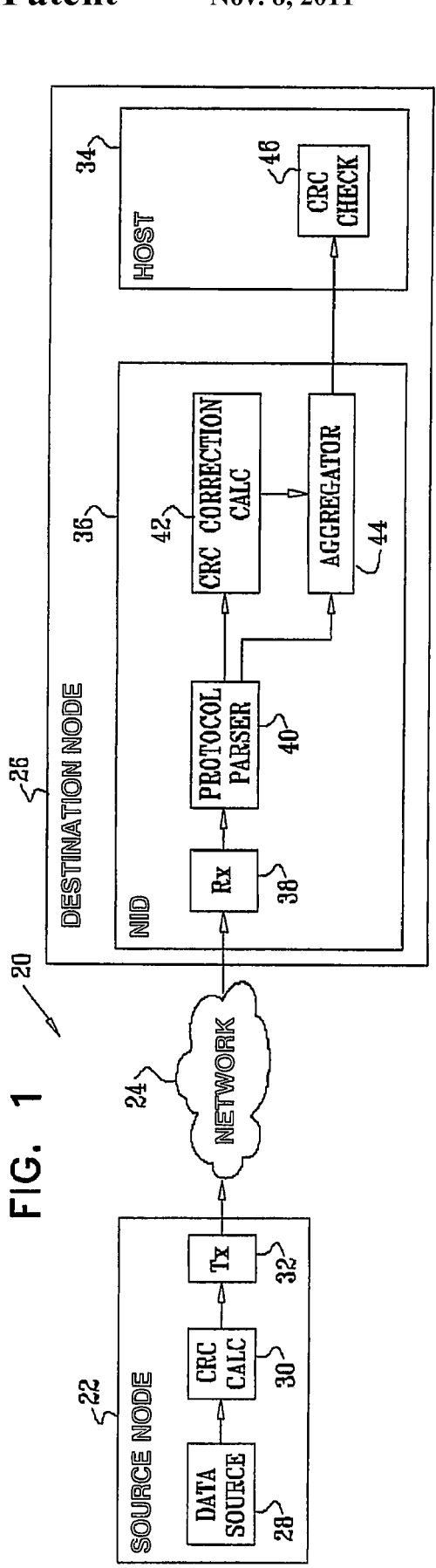
FIG. 1 is a block diagram that schematically illustrates a data communication system, in accordance with an embodiment of the present invention.

Reference is now made to FIG. 1, which is a block diagram that schematically illustrates a data communication system 20, in accordance with an embodiment of the present invention. A source node 22 conveys data blocks, typically packets, over a communications network 24 to a destination node 26. Source node 22 comprises a data source 28, typically an application running on the source node, a CRC calculator 30, and a transmit circuit 32. For each data block generated by data source 28, CRC calculator 30 calculates a CRC based on a predetermined polynomial $g(X)$, as is known in the CRC art, and appends the CRC to the data block.

Destination node 26 comprises a host computer system 34 and a network interface device (NID) 36, which provides host 34 with an interface to network 24. Host 34 offloads a portion of protocol stack processing to NID 36. Although the NID is shown as a separate component of destination node 26, the NID may be implemented as a component of host 34, such as a network interface card (NIC). NID 36 comprises a receive circuit 38, which processes the input data blocks received from network 24, and passes the blocks to a protocol parser 40. Parser 40 terminates at least one protocol of the protocol stack. To terminate the protocol, parser 40 typically extracts and reorders sub-blocks of data from the input block, and removes protocol-related data, such as headers, markers, and padding, resulting in an output block at a higher protocol level.

Parser 40 typically does not use the received CRC to check the validity of the data of the input block. Instead, a CRC correction calculator 42 of NID 36 calculates an error correction term based on the relative positions of the sub-blocks in the input block and output block, as described hereinbelow with reference to FIGS. 2 and 3. An aggregator 44 of NID 36 appends the error correction term and the original CRC to the output block, and passes the output block to host 34. NID 36 thus passes the original CRC directly from the input block to the output block, without performing any computations on or with the original CRC. NID 36 typically does not use the original CRC to validate the integrity of the input block. Such direct passing of the original CRC generally reduces the likelihood of the original CRC being corrupted because of hardware or software errors. Alternatively, NID 36 uses the original CRC to validate the integrity of the input block, and discards the input block if the CRC check fails.

NID 36 typically carries out these function in dedicated hardware, such as a custom or programmable logic chip. Alternatively, the NID may perform some or all of these functions in software, which may be downloaded to the NID in electronic form over a network, for example, or it may alternatively be supplied on tangible media, such as CD-ROM.

Upon receiving the output block, a CRC check module 46 of host 34 determines whether to accept or reject the output block. CRC check module 46 calculates the CRC of the output block, as is known in the CRC art. The CRC check module combines the original error detection code of the input block with the error correction term, typically using an XOR operation. The CRC check module compares this combined value with the calculated CRC of the output block. A match indicates that the output block is valid, while a non-match generally indicates that the output block should be discarded. Typically, host 34 comprises a standard general-purpose processor with appropriate memory, communication interfaces and software for carrying out the CRC computations described herein. This software may be downloaded to the host in electronic form over a network, for example, or it may alternatively be supplied on tangible media, such as CD-ROM.

Figure 2:
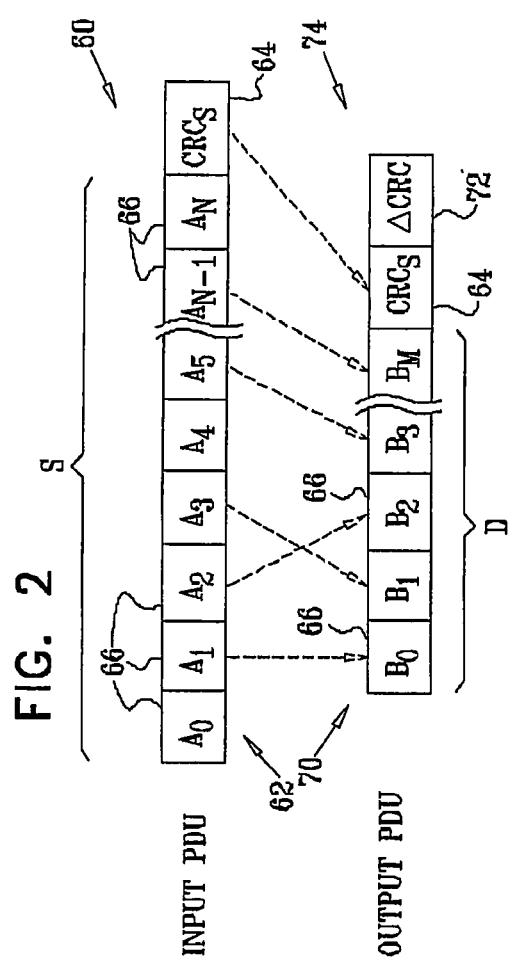
FIG. 2 is a block diagram that schematically illustrates the termination of an input Protocol Data Unit (PDU), in accordance with an embodiment of the present invention.

Reference is now made to FIG. 2, which is a block diagram that schematically illustrates the termination of an input Protocol Data Unit (PDU) 60, in accordance with an embodiment of the present invention. Input PDU 60 comprises an input block 62, labeled block S, and a CRCs 64, as calculated by CRC calculator 30 of source node 22. In order to process block S, protocol parser 40 divides block S into N+1 sub-blocks 66, labeled $A_0 \ldots A_N$, which may be of different sizes. Sub-blocks 66 represent protocol-specified data fields, such as payload, headers, markers, and padding. To generate a higher protocol level output block 70, labeled block D, parser 40 typically strips block S of a portion of the sub-blocks, and concatenates the remaining sub-blocks, not necessarily in their original order. The resulting block D comprises M+1 sub-blocks $B_0 \ldots B_M$, wherein M is less than N. In the example shown in FIG. 2, parser 40 strips sub-blocks $A_0, A_4$, and $A_N$ from block S, and reverses the order of blocks $A_2$ and $A_3$. Aggregator 44 appends to block D original CRCs 64 and an error correction term ΔCRC 72 (calculated as described hereinbelow with reference to FIG. 3), resulting in an output PDU 74, which NID 36 passes to host 34.

Figure 3:
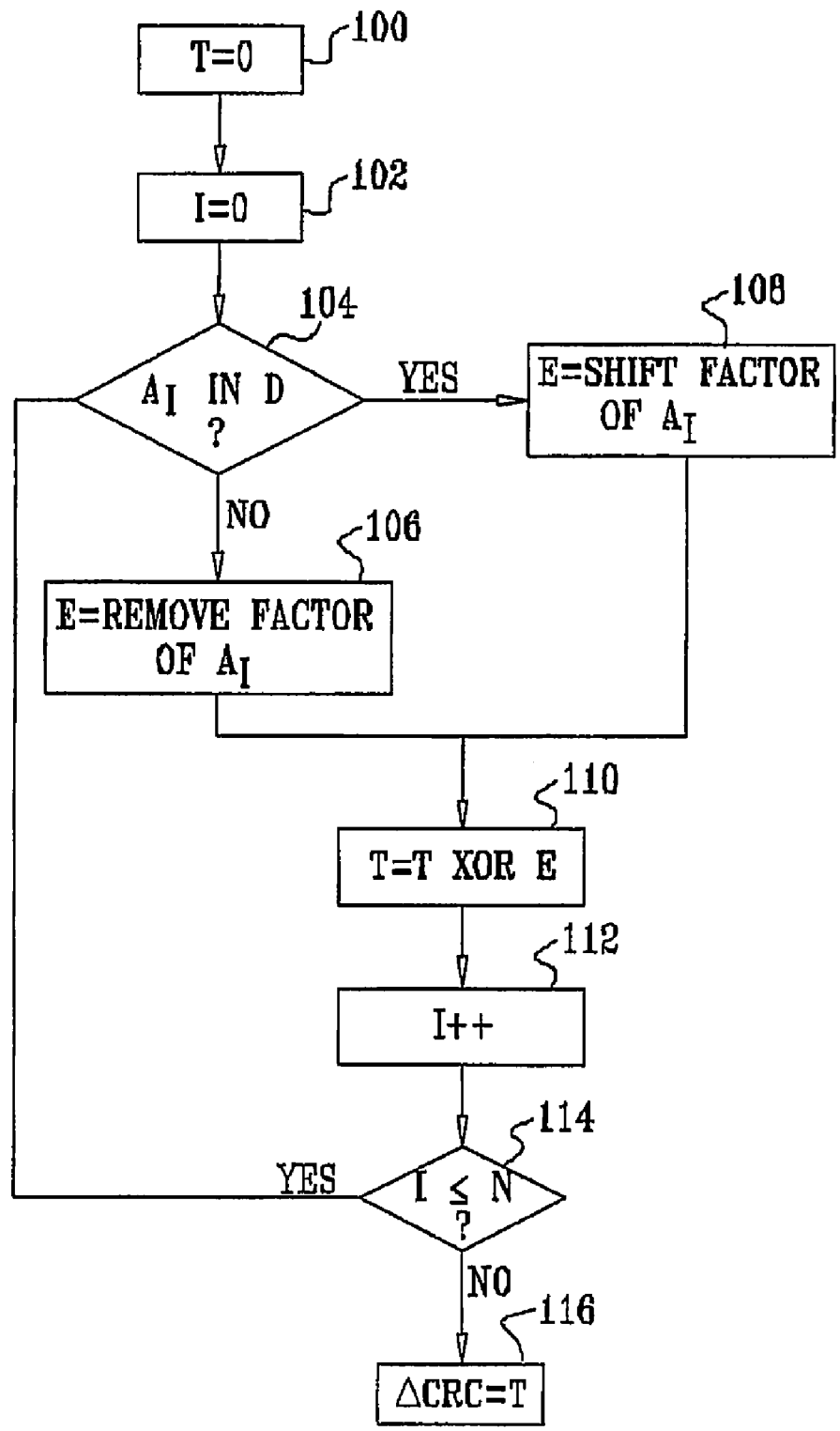
FIG. 3 is a flow chart schematically illustrating a method for calculating an error correction term for an input block, in accordance with an embodiment of the present invention.

FIG. 3 is a flow chart schematically illustrating a method for calculating error correction term 72, in accordance with an embodiment of the present invention. CRC correction calculator 42 begins the method by zeroing a correction term accumulator variable T, at a zero T step 100. Calculator 42 also zeroes a loop counter I, at a zero I step 102. Alternatively, calculator 42 uses other techniques for loop control, as will be apparent to those skilled in the art.

At an output block inclusion check step 104, calculator 42 checks whether sub-block $A_I$ is included in output block D. If calculator 42 finds that sub-block $A_I$ is not included in output block D, at a remove factor step 106 the calculator determines a temporary variable E using a remove factor defined as:

$$\text{Remove factor}(A_I, m) = (CRC(A_I) * X^m) \bmod g(X) \quad (1)$$
$$= (CRC(A_I) * (X^m \bmod g(X)))$$
$$\bmod g(X)$$

wherein $A_I$ is the sub-block being removed from block S, and m is the offset of the sub-block within the block, which offset is equal to the number of bits following the sub-block within the block. Calculator 42 uses the same primitive polynomial for this calculation as CRC calculator 30 used when calculating $CRC_S$ 64.

On the other hand, if the calculator finds that current sub-block $A_I$ is included in output block D, at a shift factor step 108 the calculator determines E using a shift factor defined as:

$$\text{Shift factor}(A_I, m, n) = (CRC(A_I) * (X^m + X^n)) \bmod g(X) \quad (2)$$
$$= (CRC(A_I) * (X^m + X^n) \bmod g(X))$$
$$\bmod g(X)$$
$$= (CRC(A_I) * (X^m \bmod g(X) +$$
$$X^n \bmod g(X)) \bmod g(X))$$

wherein $A_I$ is the sub-block whose location is different in input block S than in output block D, m is the offset of $A_I$ within block S, and n is the offset of $A_I$ within block D. Calculator 42 uses the same primitive polynomial for this calculation as CRC calculator 30 used when calculating CRCs 64. If m equals n, calculator 42 sets E equal to 0.

In either case, calculator 42 accumulates the determined value of E by setting T equal to T XOR E, at an accumulation step 110. It is to be noted that there typically is no need to store the value of sub-block $A_I$ once temporary variable E has been calculated for $A_I$.

At an increment I step 112, the calculator increments I, and, if I is less than or equal to N (the highest-numbered sub-block in input block S), as determined at a loop check step 114, calculator 42 returns to step 104 for processing the next sub-block. Otherwise, the calculator concludes the method by setting error correction term ΔCRC 72 equal to T, at a set ΔCRC step 116.

A derivation of the remove and shift factors used at steps 106 and 108 is presented hereinbelow. Numerous equations mathematically equivalent to these factors will be apparent to those skilled in the art, upon reading the present patent application, and these equivalent equations are within the scope of the present invention. For the purposes of the present derivation, each input block S is represented as a polynomial $S(X) = s_0 + s_1 X + s_2 X_2 + \ldots$, wherein the coefficients $s_0, s_1, \ldots$, are the bits of the data block. When broken into sub-blocks $A_0, \ldots, A_N$, S(X) becomes $$S(X) = \sum_{I=0}^{S} A_I(X) \cdot X^{M_I},$$

wherein $M_I$ is the offset of each sub-block within block S, and the offset is equal to the number of bits following the sub-block within block S. $CRC_S$ (the CRC of the complete input block S) is given by:

$$CRC_S = S(X) \bmod g(X)$$

wherein g(X) is a primitive polynomial, and S(X) has been augmented by a number of 0 bits equal to the length of g(x) in bits, less 1.

Taking the simple case in which S is broken into three consecutive sub-blocks $A_0, A_1$, and $A_2$, and letting the notation CRC(A,m) represent the CRC of a data block A with m zeros appended thereto (i.e., block A binary shifted by m bits), it can be seen that $CRC_S$ may also be written as:

$$CRC_S = CRC(A_0, m_1 + m_2) \; XOR \; CRC(A_1, m_2) \quad (3)$$
$$XOR \; CRC(A_2, 0) = (A_0(X) * X(m_1 + m_2))$$
$$\bmod g(X) \; XOR (A_1(X) * X_2^m) \bmod g(X)$$
$$XOR \; A_2(X) \bmod g(X)$$

wherein $m_i$ is the length in bits of sub-block $A_i$, and $A_i$ has been augmented by a number of 0 bits equal to the length of g(X), less 1. In other words, the CRC of a group of consecutive data blocks can be calculated by calculating the CRC of each data block separately while substituting zeros for the other blocks.

In these expressions, as well as in the description that follows, binary polynomial arithmetic is used, with no carries, as is known in the CRC art.

Equation (3) shows that if a sub-block is added to a data block after the CRC of the block has been calculated, the CRC can be modified to cover the bits of the additional sub-block by (a) appending the appropriate number of zeros to the additional sub-block, (b) calculating the CRC of the resulting binary-shifted sub-block, and (c) XORing the resulting sub-block CRC with the original CRC. Similarly, because addition and subtraction are equivalent in binary arithmetic using XOR operations, if a sub-block is removed from a block after the CRC of the block has been calculated, the CRC can be modified to exclude the bits of the removed sub-block using the same calculation as is used to add a sub-block. Therefore, the correction term of equation (1) for modifying a CRC of a block to remove a sub-block from the block is given by:

$$\begin{aligned}\text{Remove factor } (A_I, m) &= (A_I(X) * X^m) \bmod g(X) \quad (4)\\ &= (CRC(A_I) * X^m) \bmod g(X) \\ &= (CRC(A_I) * (X^m \bmod g(X))) \\ &\quad \bmod g(X)\end{aligned}$$

wherein $A_I$ is the sub-block being removed from the block, and m is the offset of the sub-block within the block, which offset is equal to the number of bits following the sub-block within the block. To correct the CRC of the complete block, the remove factor is XORed with the CRC. When calculator 42 uses equation (1) to calculate temporary variable E at step 106, as described hereinabove, $A_I$ is the sub-block not included in input block S.

Equation (3) also shows that if the location of a sub-block within a block is changed after the CRC of the block has been calculated, a compensating modification can be made to the CRC by removing the sub-block from its first location and adding the sub-block at its new location. Therefore, the correction term of equation (2) for modifying a CRC of a block to shift a sub-block within the block is given by:

$$\begin{aligned}\text{Shift factor } (A_I, m, n) &= (A_I(X) * X^m) \bmod g(X) \quad (5)\\ &\quad XOR(A_I(X) * X^n) \bmod g(X) \\ &= (CRC(A_I) * (X^m + X^n)) \bmod g(X) \\ &= (CRC(A_I) * (X^m + X^n)) \bmod \\ &\quad g(X)) \bmod g(X) = (CRC(A_I) * \\ &\quad (X^m \bmod g(X) + X^n \bmod g(X)) \\ &\quad \bmod g(X))\end{aligned}$$

wherein $A_I$ is the sub-block being shifted within the block, m is the offset of the original location of the sub-block within the block, and n is the offset of the new location of the sub-block within the block. To correct the CRC of the complete block, the shift factor is XORed with the CRC.

Figure 4:
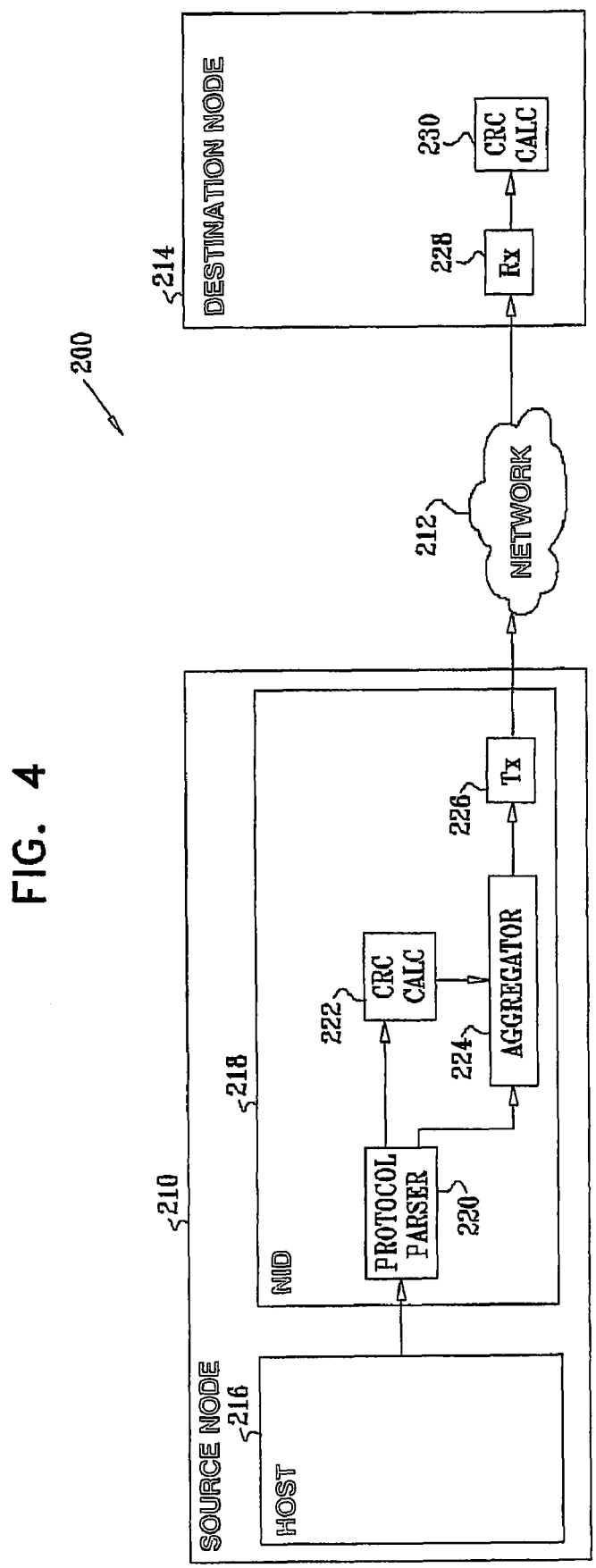
FIG. 4 is a block diagram that schematically illustrates a data communication system, in accordance with an embodiment of the present invention.

Reference is now made to FIG. 4, which is a block diagram that schematically illustrates a data communication system 200, in accordance with an embodiment of the present invention. A source node 210 conveys data blocks, typically packets, over a communications network 212 to a destination node 214. Source node 210 comprises a host 216, which generates the blocks of data, and offloads a portion of protocol stack processing to a NID 218. Typically, host 216 comprises a standard general-purpose processor with appropriate memory, communication interfaces and software for carrying out the CRC computations described herein. This software may be downloaded to the host in electronic form over a network, for example, or it may alternatively be supplied on tangible media, such as CD-ROM. Although NID 218 is shown as a separate component of source node 210, the NID may be implemented as a component of host 216, such as a network interface card (NIC).

NID 218 comprises a protocol parser 220, which terminates at least one protocol of the protocol stack. For each data block generated by host 216, a CRC calculator 222 of NID 218 calculates a CRC for at least one protocol, as described hereinbelow. An aggregator 224 of NID 218 appends the CRC to the data block, and a transmit circuit 226 of NID 218 sends the data block to network 212. NID 218 typically carries out these function in dedicated hardware, such as a custom or programmable logic chip. Alternatively, the NID may perform some or all of these functions in software, which may be downloaded to the NID in electronic form over a network, for example, or it may alternatively be supplied on tangible media, such as CD-ROM.

A receive circuit 228 of destination node 214 receives the data block from network 212, and passes it to a CRC check module 230. The CRC check module determines whether to accept or reject the block, by calculating the CRC of the block, as is known in the CRC art. For some applications, source node 210 sends data blocks to destination node 26, described with reference to FIG. 1.

Figure 5:
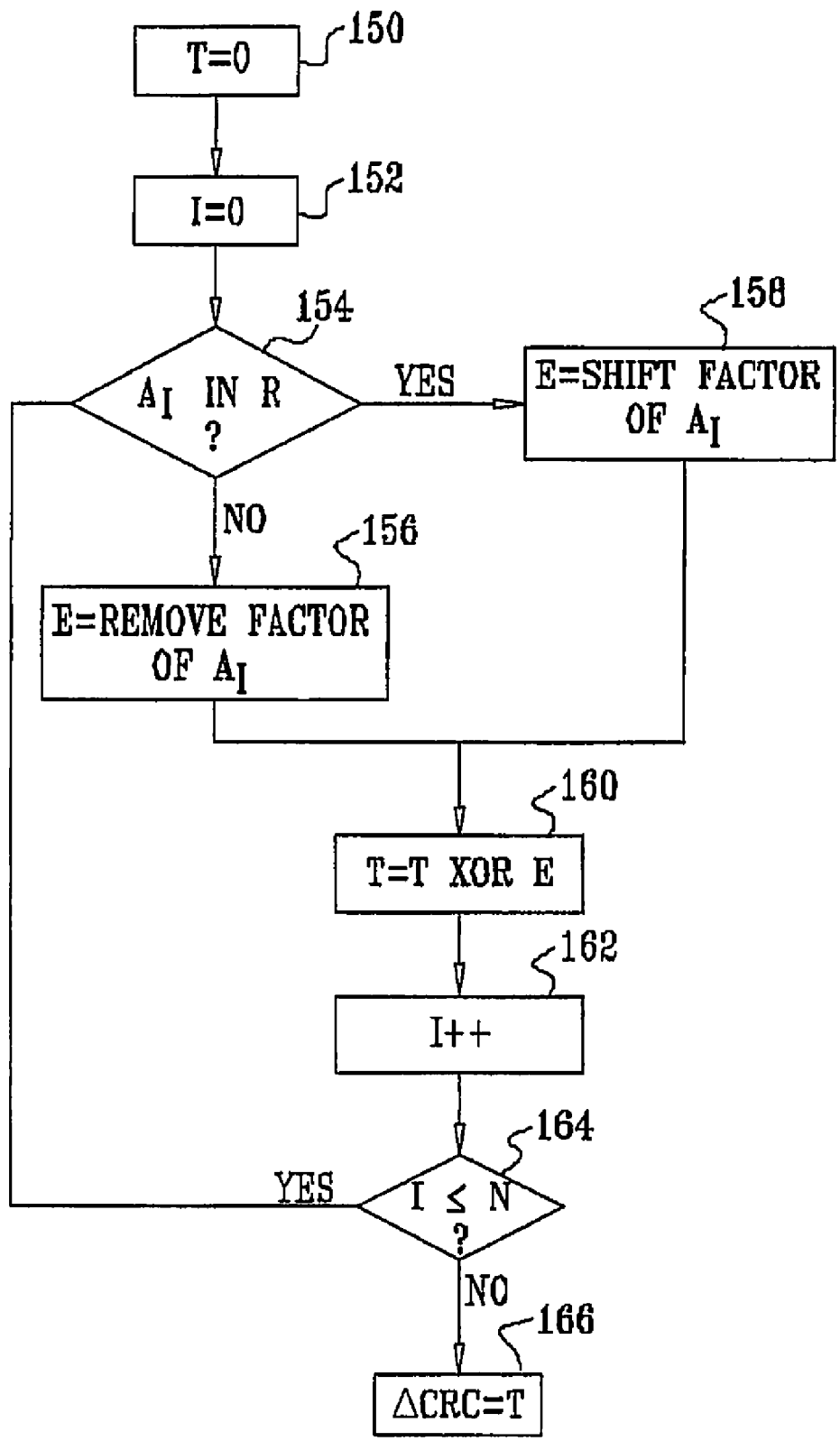
FIG. 5 is a flow chart schematically illustrating a method for calculating an error correction term for an output block assembled for transmission, in accordance with an embodiment of the present invention.

Reference is now made to FIG. 5, which is a flow chart schematically illustrating a method for calculating an error correction term ΔCRC for an output block V assembled for transmission, in accordance with an embodiment of the present invention. Host 216 generates a data block R for transmission, and calculates a $CRC_R$ for the block, using techniques known in the CRC art. The host appends the $CRC_R$ to block R, and passes block R to NID 218. (Block R is referred herein to as input block R with respect to the NID.) Protocol parser 220 of NID 218 assembles lower protocol level output data block V by dividing input block R into sub-blocks, and interspersing additional sub-blocks containing protocol-related data, such as headers, markers, and padding. The resulting output data block V has N+1 sub-blocks $A_0, \ldots, A_N$.

To compute $CRC_V$ for output block V, CRC calculator 222 of NID 218 calculates an error correction term ΔCRC based on the positions of the sub-blocks in output block V relative to their respective positions in input block R, as described immediately hereinbelow. The NID applies ΔCRC to $CRC_R$, typically using an XOR operation, in order to produce $CRC_V$. Aggregator 224 of NID 218 appends $CRC_V$ to the output block, and passes the output block to network 212.

CRC calculator 222 begins the ΔCRC calculation method by zeroing a correction term accumulator variable T, at a zero T step 150. Calculator 222 also zeroes a loop counter I, at a zero I step 152. Alternatively, calculator 222 uses other techniques for loop control, as will be apparent to those skilled in the art.

At an input block inclusion check step 154, calculator 222 checks whether sub-block $A_I$ is included in input block R. If calculator 222 finds that the sub-block is not included in input block R, the calculator determines a temporary variable E using remove factor equation (1), as described hereinabove, at a remove factor step 156, setting m to be the offset of sub-block $A_I$ within output block V. Calculator 222 uses the same primitive polynomial for this calculation as host 34 used when calculating $CRC_R$. Calculator 222 is able to use the remove factor equation to add a sub-block because, as described hereinabove, addition and subtraction are equivalent in binary XOR arithmetic.

On the other hand, if at step 154 the calculator finds that sub-block $A_I$ is included in input block R, calculator 222 determines E using shift factor equation (2), as described hereinabove, at a shift factor step 158. In this case, m is the offset of sub-block $A_I$ within input block R, and n is the offset of $A_I$ within output block V.

After calculating E, whether at step 156 or 158, calculator 222 accumulates the determined value of E by setting T equal to T XOR E, at an accumulation step 160. At an increment I step 162, the calculator increments I. If I is less than or equal to N (the highest-numbered sub-block in output block V), as determined at a loop check step 164, calculator 222 returns to step 164 for processing the next sub-block. Otherwise, the calculator concludes the method by setting error correction term ΔCRC equal to T, at a set ΔCRC step 166.

In an embodiment of the present invention, calculator 42 and/or 222 uses the following code for calculating $X^M$ mod g(X). The calculator typically uses this code for calculating $X^m$ mod g(X) and $X^{m+n}$ mod g(X) of equations (1) and (2), respectively. In this code, $m_{L-1}m_{L-2} \ldots m_1m_0$ is the L-bit representation of M.

```
T(X) = 1;
For (j=0; j<L; j++)
{
    A(X) = X ^ 2^j mod g(X);    /* get value from a table */
    If (m_j == 1)  T(X) = T(X)*A(X) mod g(X);    /*
    polynomial multiplication */
}
```

To execute the code, NID 36 or 218 provides a table containing the polynomials $X^{2^j}$ mod g(X) for j=0, 1, . . . , k, wherein $2^{k+1}-1$ is the maximum expected packet length. Polynomial multiplication may be implemented using techniques described with reference to FIG. 5 of the above-mentioned U.S. patent application Publication No. 2003/0066011 (the '011 application). In order to implement these techniques in hardware, an equation generator is typically used, which describes (a) the future state of each memory element in FIG. 5 of the '011 application, given the present state of the rest of the elements, (b) the value of the coefficients of the polynomial P, and (c) the N current bits of the polynomial Q. Appendix A presents exemplary MATLAB code for such an equation generator.

In an embodiment of the present invention, calculator 42 or 222 implements a table-based CRC calculator, for example as described with reference to FIG. 2 of the '011 application. These techniques may be implemented in hardware in a ROM table, via a combinatorial network defined by a set of equations which describe the future state of each storage element, given its current state and the N input bits. Appendix B presents exemplary MATLAB code for such an equation generator.

The equation generators of Appendix A and B are implemented as production rule grammars. Each of the character string variables S0, S1, . . . contains a string describing the content of the storage elements it represents, as a function of its previous state and the input sequence. The variables S0, S1, . . . are initialized to the strings s0(t−1), s1(t−1), . . . , respectively. The variable I represents the system input, and sequences the string values i0, i1, i2 . . . once per each clock. The system state evolves using production rules. For example, the state of storage element S0 may be determined by the production rule S0→S15^I, so that the string content of S0 is replaced by the string which is a concatenation of the strings for S15 with the string ^ (XOR) and with the string contained in I representing the current input. The production system is implemented with the MATLAB function sprintf, which performs the string manipulation. The taps of the multiplier polynomial are represented by the constants p0, p1, . . . , which are built into the production rules. Since it is generally not possible in MATLAB to have a two dimensional array of variable length strings, the main data structure ss [ ] is a vector that stores, in a concatenated form, all of the strings representing S0, S1, . . . . The matrix b[:,:] is used to determine the boundaries of each string. The string Sj occupies the substring of ss starting in b[j,1] and ending in b[j,2].

Appendix C presents an exemplary implementation of several calculations performed by calculator 42 or 222 in MATLAB code, in accordance with an embodiment of the present invention. The MATLAB implementation includes the following files:

block_crc—calculates the CRC of a block of data
   crc_m—implements the procedure CRC_REMOVE
   crc_m_n—implements the procedure CRC_SHIFT
   mult_mod—implements polynomial multiplication
   exp_mod—implements X.sup.M mode g(X)

Other implementations of the CRC arithmetic necessary for carrying out the methods described above will be apparent to those skilled in the art and are considered to be within the scope of the present invention.

Although the embodiments described hereinabove refer specifically to certain communication protocols, such as TCP/IP, and types of error detecting codes, such as CRCs, the principles of the present invention may similarly be applied to data communications using other protocols, which may use error detecting codes of other types. The advantages of the present invention in the context of other protocols, coding algorithms and applications will be apparent to those skilled in the art.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for error detection, comprising:
    receiving a block of data having a modulo-based input error detection code and an error correction term appended thereto;
    calculating an output error detection code of the block;
    combining the input error detection code and the error correction term to produce a modified error detection code; and
    comparing the calculated error detection code to the modified error detection code so as to detect an error in the block.

2. The method according to claim 1, wherein combining the appended error detection code and the error correction term comprises applying an XOR operation.

3. A non-transient machine-readable storage having stored thereon, a computer program having at least one code section for error detection, the at least one code section being executable by a machine for causing the machine to perform steps comprising:
    receiving a block of data having a modulo-based input error detection code and an error correction term appended thereto;
    calculating an output error detection code of the block;
    combining the input error detection code and the error correction term to produce a modified error detection code; and
    comparing the calculated error detection code to the modified error detection code so as to detect an error in the block.

4. The machine readable storage according to claim 3, wherein combining the appended error detection code and the error correction term comprises applying an XOR operation.

5. A system for error detection, the system comprising:
    one or more processors that enable, at least:
    receiving a block of data having a modulo-based input error detection code and an error correction term appended thereto;
    calculating an output error detection code of the block;
    combining the input error detection code and the error correction term to produce a modified error detection code; and
    comparing the calculated error detection code to the modified error detection code so as to detect an error in the block.

6. The system according to claim 5, wherein combining the appended error detection code and the error correction term comprises applying an XOR operation.

7. A data receiver, comprising:
    a receiving circuit, configured to receive a block of data having a modulo-based input error detection code and an error correction term appended thereto; and
    an error detection circuit, which is coupled to compute an output error detection code of the block received by the receiving circuit, to combine the input error detection code and the error correction term to produce a modified error detection code, and to compare the calculated error detection code to the modified error detection code so as to detect an error in the block.

8. The receiver according to claim 7, wherein the error detection circuit is configured to combine the appended error detection code and the error correction term by applying an XOR operation.

9. A computer software product for receiving data, the product comprising a non-transient computer-readable medium in which program instructions are stored, which instructions, when read by a computer, cause the computer to receive a block of data having a modulo-based input error detection code and an error correction term appended thereto, to compute an output error detection code of the block, to combine the input error detection code and the error correction term to produce a modified error detection code, and to compare the calculated error detection code to the modified error detection code so as to detect an error in the block.

10. The product according to claim 9, wherein the instructions cause the computer to combine the appended error detection code and the error correction term by applying an XOR operation.

* * * * *

UNITED STATES PATENT AND TRADEMARK OFFICE
CERTIFICATE OF CORRECTION

| | | |
|---|---|---|
| PATENT NO. | : 8,055,990 B2 | Page 1 of 1 |
| APPLICATION NO. | : 11/834835 | |
| DATED | : November 8, 2011 | |
| INVENTOR(S) | : Oren | |

It is certified that error appears in the above-identified patent and that said Letters Patent is hereby corrected as shown below:

On the cover sheet, Item 62 related U.S. Application Data, please replace "January 4, 2004" with "January 14, 2004"

Signed and Sealed this
Tenth Day of April, 2012

David J. Kappos
*Director of the United States Patent and Trademark Office*